(12) United States Patent
Kim et al.

(10) Patent No.: US 9,275,593 B2
(45) Date of Patent: Mar. 1, 2016

(54) DISPLAY PANEL HAVING STATIC ELECTRICITY PROTECTION

(71) Applicant: SAMSUNG DISPLAY CO., LTD., Yongin, Gyeonggi-do (KR)

(72) Inventors: Kwi-Hyun Kim, Suwon-si (KR); Jang-Soo Kim, Yongin-si (KR); Hyeong-Jun Jin, Seoul (KR); Soo-Chul Kim, Uijeongbu-si (KR); Kyoung-Hae Min, Incheon (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/459,140

(22) Filed: Aug. 13, 2014

(65) Prior Publication Data

US 2014/0347349 A1    Nov. 27, 2014

Related U.S. Application Data

(63) Continuation of application No. 13/070,394, filed on Mar. 23, 2011, now abandoned.

(30) Foreign Application Priority Data

Oct. 20, 2010    (KR) .................. 10-2010-0102434

(51) Int. Cl.
| | |
|---|---|
| *G06F 3/038* | (2013.01) |
| *G09G 5/00* | (2006.01) |
| *G09G 3/36* | (2006.01) |
| *G11C 19/28* | (2006.01) |

(52) U.S. Cl.
CPC .............. *G09G 3/3677* (2013.01); *G11C 19/28* (2013.01); *G09G 2300/0408* (2013.01); *G09G 2300/0417* (2013.01); *G09G 2300/0426* (2013.01); *G09G 2310/0286* (2013.01); *G09G 2330/04* (2013.01)

(58) Field of Classification Search
USPC ............................................ 345/204; 349/43
See application file for complete search history.

(56) References Cited

U.S. PATENT DOCUMENTS

| | | | |
|---|---|---|---|
| 3,777,278 A | 12/1973 | Majeau et al. | |
| 2003/0222311 A1* | 12/2003 | Kim | ................................ 257/347 |
| 2009/0243985 A1* | 10/2009 | Park et al. | ........................ 345/92 |
| 2010/0134234 A1* | 6/2010 | Liao et al. | ........................ 337/75 |

FOREIGN PATENT DOCUMENTS

| | | |
|---|---|---|
| JP | 2008203761 | 9/2008 |
| KR | 1020060024234 | 3/2006 |
| KR | 1020080103848 | 11/2008 |

\* cited by examiner

*Primary Examiner* — Kwang-Su Yang
(74) *Attorney, Agent, or Firm* — Innovation Counsel LLP

(57) ABSTRACT

In one embodiment, a display panel includes a substrate and a gate driver disposed on the substrate. The gate driver comprises a wiring unit which receives signals and a circuit unit which outputs driving signals in response to the signals received from the wiring unit. The circuit unit comprises a shift register and a shift register wiring connected to the shift register. The wiring unit comprises first through n-th signal lines (n is a natural number greater than two) arranged sequentially adjacent to the shift register. The first line is located farthest from the shift register and the n-th signal line is closest from the shift register. Further, the first signal line is electrically connected to the shift register by a first connection line that comprises a first contact portion connected to the first signal line and a second contact portion connected to the shift resistor wiring.

21 Claims, 6 Drawing Sheets

DISPLAY PANEL HAVING STATIC ELECTRICITY PROTECTION

This application is a continuation of U.S. patent Ser. No. 13/070,394, filed Mar. 23, 2011, which claims priority from Korean Patent Application No. 10-2010-0102434 filed on Oct. 20, 2010 in the Korean Intellectual Property Office, the disclosure of which application is incorporated herein by reference in its entirety.

BACKGROUND

1. Field of Disclosure

The present disclosure of invention relates to a gate driver structured such that its elements are better protected against being burned by static electricity and a liquid crystal display (LCD) including the gate driver.

2. Description of Related Technology

Generally, a liquid crystal display (LCD) includes a display panel having a plurality of gate lines and a plurality of data lines, a gate driver transmitting a plurality of gate signals to the gate lines, and a data driver transmitting a plurality of data signals to the data lines.

In a conventional LCD, each of the gate driver and data driver is mounted on a display panel in the form of one or more respective IC chips. However, attempts are being made to monolithically integrate at least one of the gate driver and the data driver on a same substrate having the thin-film transistors (TFTs) of the LCD in order to reduce the total size of the display device and to improve productivity and reliability. That is, a gate driver circuit which generates the gate signals of a TFTs-containing substrate is integrally formed on that substrate using an amorphous silicon TFT technology that directly mounts the gate driver circuit on the same glass substrate where the pixels and their respective TFT switching transistors are formed.

However, when a plurality of amorphous silicon TFTs are disposed on a glass or alike substrate to thus integrally form such a gate driver, static electricity generated in manufacturing facilities may flow to a gate driving circuit through an edge of the substrate and undesirably burn out elements of the gate driving circuit. Since the generation of static electricity in the manufacturing facilities cannot be prevented completely, it is desirable to develop a gate driver structured such that its elements are protected against being burned out by static electricity flowing thereto.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

Aspects of the present disclosure provide a gate-lines driver circuit structured such that the danger of its elements being burned out by static electricity is reduced.

Aspects of the present disclosure also provide a liquid crystal display (LCD) including the static electricity tolerant gate-lines driver circuit.

According to a more detailed aspect of the present teachings, there is provided a display panel comprising a substrate; a gate driver disposed on the substrate, the gate driver comprising: a wiring unit which receives signals; and a circuit unit which outputs driving signals in response to the signals received from the wiring unit, the circuit unit comprises a shift register and a shift register wiring connected to the shift register, wherein the wiring unit comprises first through n-th signal lines (n is a natural number greater than two) arranged sequentially adjacent to the shift register, wherein the first line is located farthest from the shift register and the n-th signal line is closest from the shift register, wherein the first signal line is electrically connected to the shift register by a first connection line, the first connection line comprises a first contact portion connected to the first signal line and a second contact portion connected to the shift resistor wiring, wherein the second contact portion is disposed between the n-th signal line and the shift resistor in a plan view.

According to another aspect of the present disclosure, there is provided a display panel comprising a substrate; a gate driver disposed on the substrate, the gate driver comprising: a wiring unit which receives signals; and a circuit unit which outputs driving signals in response to the signals received from the wiring unit, the circuit unit comprises a shift register and a shift register wiring connected to the shift register, wherein the wiring unit comprises first through n-th signal lines (n is a natural number greater than two) arranged sequentially adjacent to the shift register, wherein the first signal line is electrically connected to the shift register by a first connection line, the first connection line comprises a first contact portion connected to the first signal line and a second contact portion connected to the shift resistor wiring, and the display panel further comprising a first insulating layer disposed on the first through n-th signal lines, and a second insulating layer disposed on the first insulating layer, wherein the shift register wiring is disposed between the first insulating layer and the second insulating layer, and the first connection line is disposed on the second insulating layer.

According to another aspect of the present disclosure, there is provided a display panel comprising a substrate; a gate driver disposed on the substrate, the gate driver comprising: a wiring unit which receives signals; and a circuit unit which outputs driving signals in response to the signals received from the wiring unit, the circuit unit comprises a shift register and a shift register wiring connected to the shift register, wherein the wiring unit comprises first through n-th signal lines (n is a natural number greater than two) arranged sequentially adjacent to the shift register, wherein the first line is located farthest from the shift register and the n-th signal line is closest from the shift register, wherein the first signal line is electrically connected to the shift register by a first connection line, the first connection line comprises a first contact portion connected to the first signal line and a second contact portion connected to the shift resistor wiring, and wherein the shift register wiring does not overlap the first signal line in a plan view.

Other aspects of the present teachings will become apparent from the below detailed description.

BRIEF DESCRIPTION OF THE DRAWINGS

The above and other aspects and features of the present disclosure of invention will become more apparent by describing in detail exemplary embodiments thereof with reference to the attached drawings, in which.

DETAILED DESCRIPTION

Figure 1:
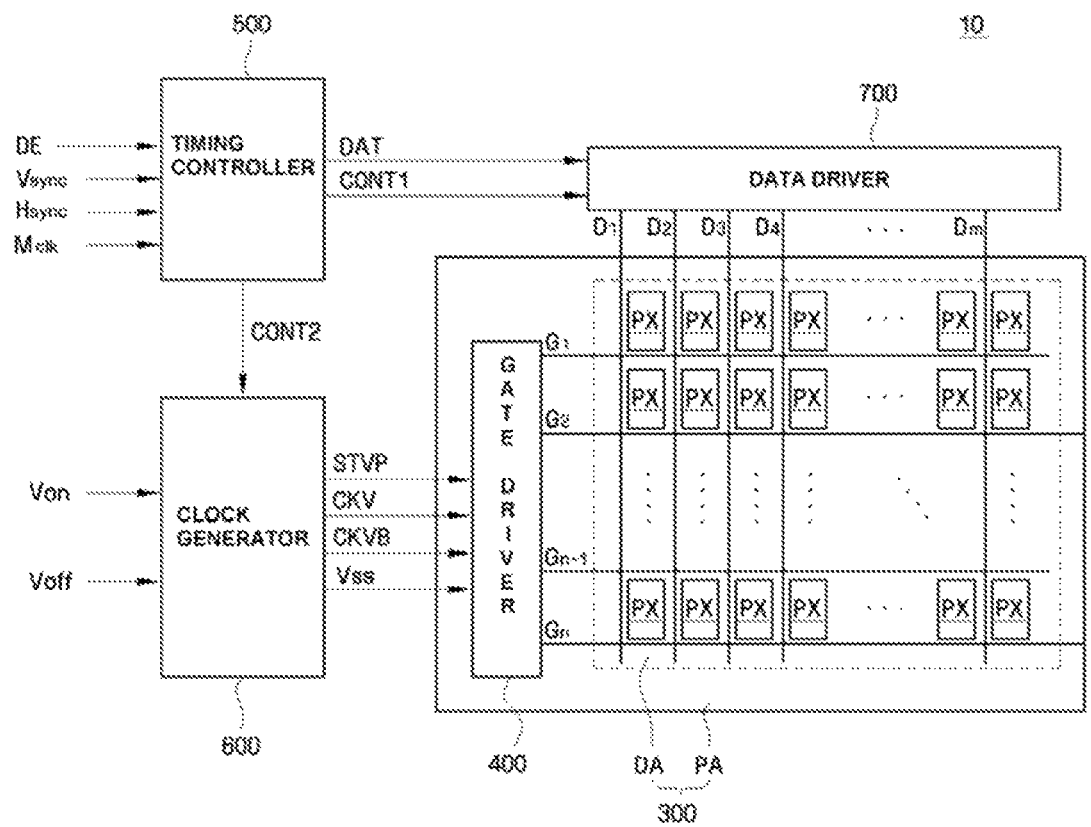
FIG. 1 is a plan view of a gate driver and a liquid crystal display (LCD) including the same according to an exemplary embodiment of the present disclosure.

Advantages and features of the present teachings may be understood more readily by reference to the following detailed description of exemplary embodiments and the accompanying drawings. The present teachings may, however, be embodied in many different forms and should not be construed as being limited to the embodiments set forth herein. Rather, these embodiments are provided so that this disclosure will be thorough and complete and will fully convey the concepts of the present teachings to those skilled in the corresponding art. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments in accordance with the disclosure are described herein with reference to plan and cross-section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present disclosure.

Also, since a drain (or drain electrode) and a source (or source electrode) may be named differently according to the direction of current, an element called a drain or drain electrode hereinafter may operate as a source or source electrode, and an element called a source or source electrode may operate as a drain or drain electrode. Accordingly, an element called a drain or drain electrode is not limited to the drain or drain electrode. Also, the element called the source or source electrode is not limited to the source or source electrode.

Hereinafter, exemplary embodiments of a gate-lines driver circuit and a liquid crystal display (LCD) including the same will be described in detail with reference to the accompanying drawings.

Figure 2:
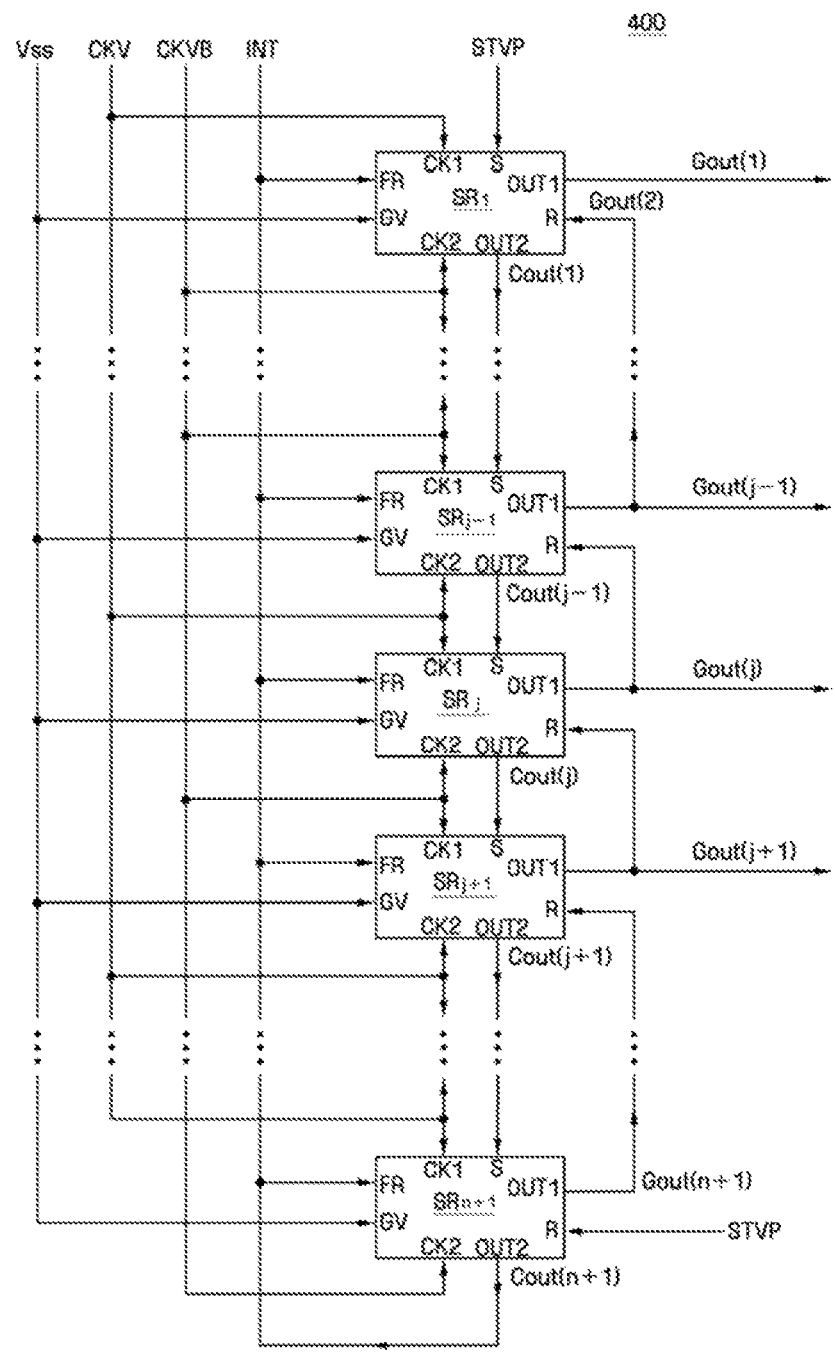
FIG. 2 is an exemplary block diagram illustrating shift registers that constitute the gate driver shown in FIG. 1.
Figure 3:
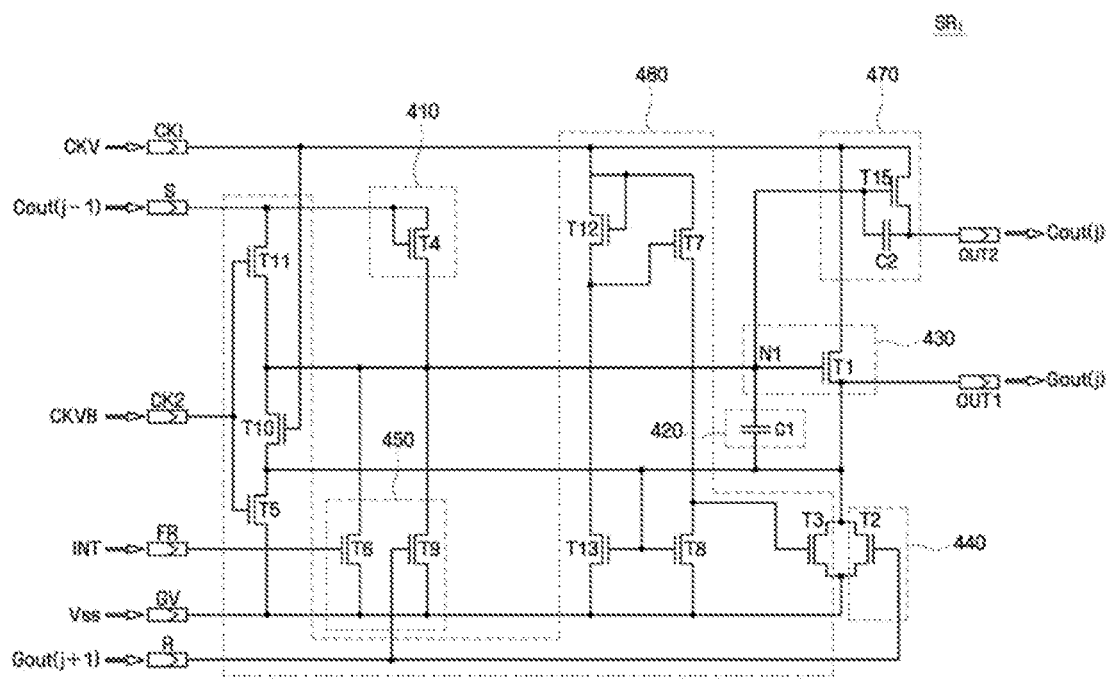
FIG. 3 is an exemplary circuit diagram of a $j^{th}$ shift register shown in FIG. 2.
Figure 4:
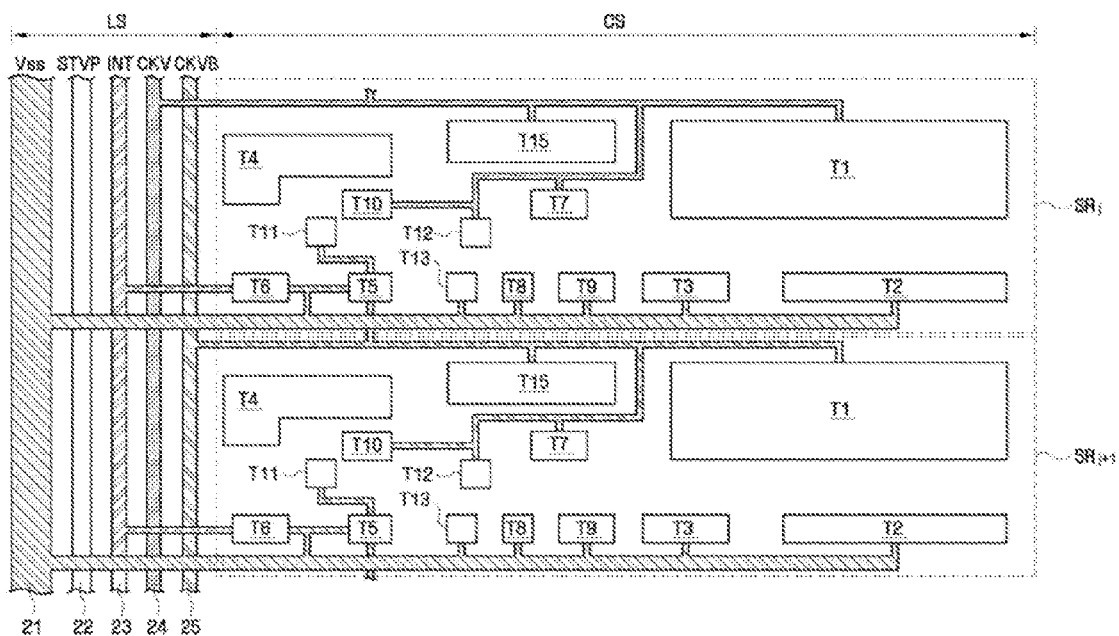
FIG. 4 is a schematic layout diagram of the gate driver shown in FIG. 1.
Figure 5:
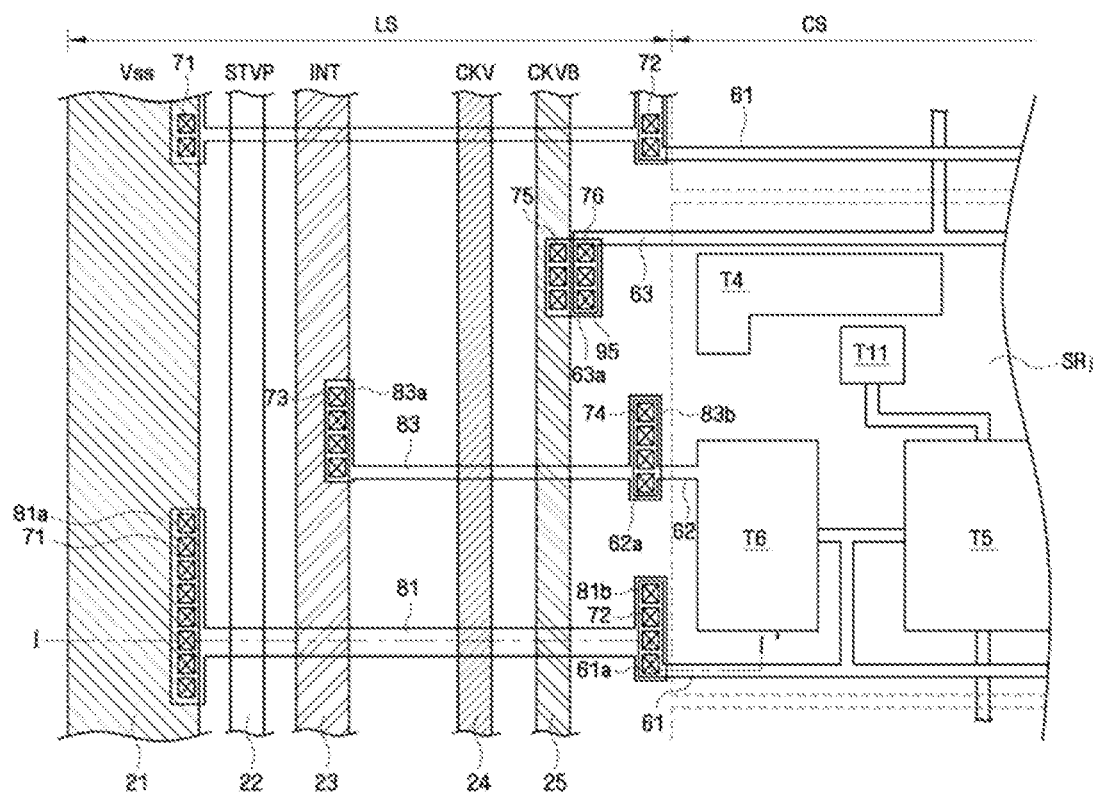
FIG. 5 is an exemplary schematic layout diagram of a wiring unit of the gate driver shown in FIG. 1.
Figure 6:
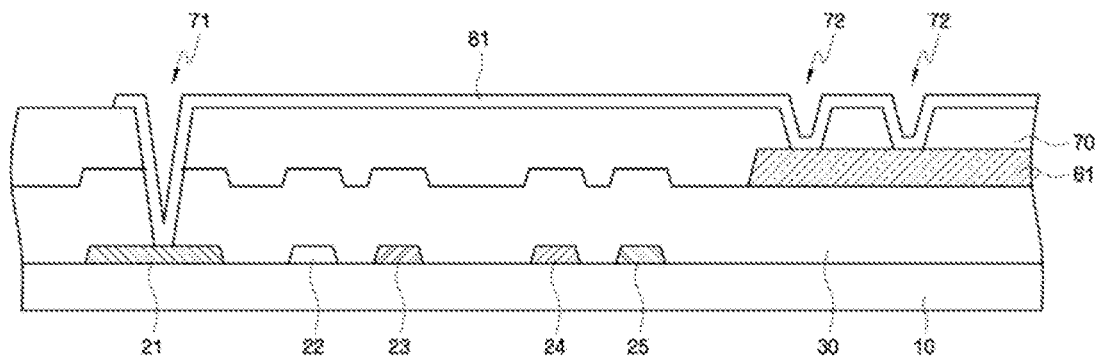
FIG. 6 is a cross-sectional view of the wiring unit taken along the line I-I' of FIG. 5.

A gate-lines driver and an LCD that integrally incorporates the same according to a first exemplary embodiment of the present disclosure will now be described with reference to FIGS. 1 through 6. FIG. 1 is a schematic of a gate driver 400 and an LCD 10 including the same according to the first exemplary embodiment. FIG. 2 is an exemplary block diagram illustrating shift registers $SR_1$ through $SR_{n+1}$ that constitute the gate driver 400 shown in FIG. 1. FIG. 3 is an exemplary circuit diagram of a $j^{th}$ shift register $SR_j$ shown in FIG. 2. FIG. 4 is a schematic layout diagram of the gate driver 400 shown in FIG. 1. FIG. 5 is an exemplary schematic layout diagram of a wiring unit LS of the gate driver 400 shown in FIG. 1. FIG. 6 is a cross-sectional view of the wiring unit LS taken along the line I-I' of FIG. 5.

Referring first to FIG. 1, the display device 10 according to the current exemplary embodiment includes a liquid crystal panel 300, a gate driver 400 integrally incorporated in the panel 300, a timing controller 500, a clock generator 600, and a data driver 700.

The liquid crystal display 300 is divided into a display area DA in which an image is displayed and a non-display or peripheral area PA in which the image is not displayed.

To display the image, the display area DA includes a first substrate (not explicitly shown) on which there are formed a plurality of gate lines G1 through Gn, a plurality of data lines D1 through Dm, a plurality of pixel switching devices (not explicitly shown) and a plurality of pixel electrodes (not explicitly shown) are disposed. Moreover, a second substrate (not shown) is further provided and spaced apart from the first substrate where the second substrate has a plurality of color filters (not shown) and a common electrode (not shown). A liquid crystal layer (not shown) is interposed between the first and second substrates and orientations of its liquid crystal molecules are controlled by electric fields formed between the pixel-electrodes and corresponding portions of the common electrode.

The gate lines G1 through Gn and the data lines D1 through Dm respectively extend on their supporting first substrate in the display area DA thereof and in respective a row and column directions. In addition, switching devices and a plurality of pixels PX connected to the gate lines G1 through Gn and the data lines D1 through Dm are formed in pixel regions PX defined by intersections of the gate lines G1 through Gn and the data lines D1 through Dm.

The non-display area PA is a region in which no image is displayed. One reason why no image is displayed there in the PA area of a given embodiment can be because the first substrate of that embodiment is wider than the second substrate.

The timing controller 500 receives input control signals, such as a horizontal synchronization signal Hsync, a main clock signal Mclk and a data enable signal DE, and outputs an image signal DAT and a first control signal CONT1. The first control signal CONT1 controls the operations of the data driver 700. Examples of the first control signal CONT1 include a horizontal start signal for starting the data driver 700 and a load signal for instructing the output of corresponding analog data voltages. The timing controller 500 sends a vertical synchronization start signal to the clock generator 600 by being synchronized with a vertical synchronization signal Vsync and provides a second control signal CONT2 to the clock generator 600.

The clock generator 600 receives the second control signal CONT2 from timing controller 500 and outputs a clock signal CKV and a clock bar signal CKVB. That is, in response to the second control signal CONT2, the clock generator 600 outputs the clock signal CKV and the clock bar signal CKVB using a gate-on voltage level, Von and a gate-off voltage level Voff. Examples of the second control signal CONT2 include an output enable signal OE and a gate clock signal CPV. The clock signal CKV and the clock bar signal CKVB are pulse signals that swing between the gate-on voltage level Von and the gate-off voltage level Voff. The clock signal CKV may be a reverse phase signal of the clock bar signal CKVB.

The data driver 700 receives the image signal DAT and the first control signal CONT1 from the timing controller 500 and provides corresponding image data voltages to the data lines D1 through Dm, respectively. The data driver 700 may be disposed as monolithically integrated circuits (ICs) whose terminals are connected to the liquid crystal panel 300 in the form of a tape carrier package (TCP). However, the present disclosure of invention is not limited to such discrete coupling of the data driver 700. The data driver 700 may alternatively be disposed in the non-display area PA of the first substrate.

The gate driver 400 may be disposed in the non-display area PA of the first substrate. Although only a one-side version is shown in the drawings, a plurality of the gate drivers 400 may be respectively disposed on two opposed sides of the non-display region PA of the first substrate with the display area DA between them. In the latter case, a gate driver 400a (not shown) disposed on a first side of the non-display area PA of the first substrate may drive, e.g., even gate lines of the gate lines, while a different gate driver 400b (not shown) disposed on the opposite second side of the non-display area PA may drive, e.g., odd gate lines of the gate lines. Alternatively, the gate drivers 400 formed on both sides of the non-display region PA may each drive all of the gate lines G1 through Gn, respectively.

When enabled by a scan start signal STVP, the gate driver 400 generates a plurality of gate signals using the clock signal CKV, the clock bar signal CKVB and a direct current (DC) voltage signal Vss. The gate driver 400 sequentially transmits Von pulses of the gate signals to corresponding ones the gate lines G1 through Gn, one after the next.

Referring to FIG. 2, the gate driver 400 includes a plurality of shift registers $SR_1$ through $SR_{n+1}$, where n is a natural number greater than one. The shift registers $SR_1$ through $SR_{n+1}$ receive the clock signal CKV, the clock bar signal CKVB and the DC voltage signal Vss and sequentially provide a plurality of gate signals to the gate lines G1 through Gn. The gate lines G1 through Gn are connected to output terminals of the shift registers $SR_1$ through $SR_{n+1}$, respectively. The shift registers $SR_1$ through $SR_{n+1}$ are connected to each other in a cascade manner. The shift registers $SR_1$ through $SR_n$, (this excluding the last shift register $SR_{n+1}$), are connected to the gate lines G1 through Gn, respectively, and output their corresponding gate signals $Gout_{(1)}$ through $Gout_{(n)}$ to the gate lines G1 through Gn, respectively. That is, the shift registers $SR_1$ through $SR_n$ receive the DC voltage signal Vss, the clock signal CKV and the clock bar signal CKVB and a direct or relayed version of the scan start signal STVP and they responsively and sequentially output their respective gate signals $Gout_{(1)}$ through $Gout_{(n)}$, each having a predetermined turn-on level of voltage (Von) for a predetermined period of time, to the gate lines G1 through Gn.

Each of the shift registers $SR_1$ through $SR_{n+1}$ includes a first clock terminal CK1, a second clock terminal CK2, a set terminal S, a reset terminal R, a source voltage terminal GV (ground voltage), a frame reset terminal FR, a gate signal output terminal OUT1 and a carry output terminal OUT2.

For purposes of explanation, the $j^{th}$ shift register $SR_j$, for example, connected to a $j^{th}$ gate line (where j≠1 and is a natural number ranging from 2 through n−1) will now be described in further detail still with reference to FIG. 2. A carry signal $Cout_{(j-1)}$ of a previous shift register, e.g., the $(j-1)^{th}$ shift register $SR_{j-1}$, is input to the set terminal S of the $j^{th}$ shift register $SR_j$, the gate signal $Gout_{(j+1)}$ of a subsequent shift register, e.g., the $(j+1)^{th}$ shift register $SR_{j+1}$, is input to the reset terminal R of the $j^{th}$ shift register $SR_j$, and the clock signal CKV and the clock bar signal CKVB are input to the first clock terminal CK1 and the second clock terminal CK2, respectively, of the $j^{th}$ shift register $SR_j$. (However, in the next shift register $SR_{j+1}$, the respectiveness between CKV and CK1 versus CKVB and CK2 is reversed. CK1 gets the CKVB signal and CK2 gets the CKV signal.)

In addition, the DC voltage signal Vss is input to the source voltage terminal GV of the $j^{th}$ shift register $SR_j$, and an initialization signal INT or, alternatively, a carry signal $Cout_{(n+1)}$ of a last shift register, e.g., the $(n+1)^{th}$ shift register $SR_{n+1}$, is input to the frame reset terminal FR of the $j^{th}$ shift register $SR_j$. The gate output terminal OUT1 outputs the gate signal $Gout_{(j)}$, and the carry output terminal OUT2 outputs a carry signal $Cout_{(j)}$ for application to the S input of the next stage.

In the case of the first shift register $SR_1$ of the chain however, the scan start signal STVP, instead of a carry signal of a previous shift register of the first shift register $SR_1$, is input to the first shift register $SR_1$. In addition, the scan start signal STVP, instead of a gate signal of a next shift register of the last shift register $SR_{n+1}$, is input to the last shift register $SR_{n+1}$. The scan start signal STVP input to the first shift register $SR_1$ is substantially the same as the scan start signal STVP input to the last shift register $SR_{n+1}$.

The internal circuitry of the $j^{th}$ shift register $SR_j$ shown in FIG. 2 will now be described in further detail with reference to FIG. 3. Referring to FIG. 3, the $j^{th}$ shift register $SR_j$ includes a buffer unit 410, a charging unit 420, a pull-up unit 430, a carry signal generation unit 470, a pull-down unit 440, a discharging unit 450, and a holding unit 460. Each of the charging unit 420, discharging unit 450, and buffer unit 410 is connected to a so-called node N1 line within the $j^{th}$ shift register $SR_j$. The carry signal $Cout_{(j-1)}$ of the previous shift register $SR_{j-1}$, the clock signal CKV, and the clock bar signal CKVB are provided to the $j^{th}$ shift register $SR_j$.

The buffer unit 410 includes a transistor T4. A gate electrode and a drain electrode of the transistor T4 are shorted together and connected to the set terminal S of the $j^{th}$ shift register $SR_j$. Since the gate and drain electrode of the transistor T4 are connected to each other, transistor T4 operates substantially like a diode. The buffer unit 410 provides to the N1 node, the high level if present of the carry signal $Cout_{(j-1)}$ of the previous shift register $SR_{j-1}$, which is received through the set terminal S. In other words, if N1 is low, the buffer unit 410 provides a recharging voltage to the charging unit 420, as well as to the gate of the carry signal generation unit 470, and to the gate of the pull-up unit 430.

The charging unit 420 includes a capacitor C1 including a first terminal, which first terminal is connected to a source electrode of the transistor T4, to the gate of the pull-up unit 430 and to the drain of the discharging unit 450. The capacitor C1 further includes a second terminal which is connected to the first output terminal OUT1.

The pull-up unit 430 includes a gate-line driving transistor (TFT) T1 including a drain electrode connected to the first clock terminal CK1, a gate electrode connected to the charging unit 420, and a source electrode connected to the gate-line driving first output terminal, OUT1.

The carry signal generation unit 470 includes a transistor T15 and a second capacitor C2. The transistor T15 includes a drain electrode connected to the first clock terminal CK1, a source electrode connected to the carry signal outputting terminal OUT2, and a gate electrode connected to the buffer unit 410. In addition, the capacitor C2 is connected between the gate electrode and source electrode of the transistor T15.

The pull-down unit 440 includes a transistor T2 including a drain electrode connected to the source electrode of the transistor T1 and the second terminal of the capacitor C1, a source electrode connected to the voltage source terminal GV, and a gate electrode connected to the reset terminal R. Here, the gate electrode controls the transistor T2 by receiving the gate signal $Gout_{(j+1)}$ of the next shift register $SR_{j+1}$. Accordingly, if the $Gout_{(j+1)}$ signal of the next shift register $SR_{j+1}$ is high (logic high ("1") as well as voltage high), the pull-down unit 440 will be activated to pull the gate-line driving first output terminal, OUT1 low.

The discharging unit 450 includes transistors T6 and T9. The transistor T9 includes a gate electrode connected to the reset terminal R, a drain electrode connected to the first terminal of the capacitor C1, and a source electrode connected to the voltage source terminal GV. The transistor T9 discharges the charging unit 420 in response to the gate signal $Gout_{(j+1)}$ of the next shift register $SR_{(j+1)}$. In other words, if the Gout $_{(j+1)}$ signal of the next shift register $SR_{j+1}$ is high, the discharging unit 450 will be activated to pull the N1 node low. The transistor T6 includes a gate electrode connected to the frame reset terminal FR, a drain electrode connected to the first terminal of the capacitor C1, and a source electrode connected to the voltage source terminal GV. The transistor T6 discharges the charging unit 420 in response to the initialization signal INT. In other words, if the INT signal is high, the discharging unit 450 will be activated to pull the N1 node low.

The holding unit 460 includes a large plurality of transistors, namely, T3, T5, T7, T8, T10, T11, T12 and T13. When the gate-line driving signal $Gout_{(j)}$ shifts from a low level to a high level, the holding unit 460 switches to state in which it urges the gate signal $Gout_{(j)}$ to remain at the high level. Likewise, when the gate-line signal $Gout_{(j)}$ shifts from a high level to a low level, the holding unit 460 switches to state in which it urges the gate signal $Gout_{(j)}$ to remain at the low level during a frame, where the held level is without regard to switching voltage levels of other signals such as those of the clock signal CKV or the clock bar signal CKVB. (It is understood that the driven gate line connected to the OUT1 terminal has inherent capacitance and this works to keep the gate-line signal $Gout_{(j)}$ steady.)

Hereinafter, a layout of the drive signals wiring of the gate-line driver circuit 400 shown in FIG. 1 will be described in detail with reference to FIGS. 4 through 6.

Referring to FIGS. 4 and 5, the layout of the gate driver 400 includes circuit unit (CS). This circuit unit (CS) includes the plurality of shift registers $SR_1$ through $SR_{n+1}$. The layout of the gate driver 400 further includes a wiring unit (LS). This wiring unit (LS) contains vertically elongated conductors and horizontally elongated conductors which deliver various external signals (Vss, STVP, INT, CKV, CKVB, etc.) to the shift registers $SR_1$ through $SR_{n+1}$.

In more detail, the circuit unit CS includes the shift registers $SR_1$ through $SR_{n+1}$, each including its respective plurality of TFTs T1 through T13 and T15. Referring to the arrangement of the transistors T1 through T13 and T15 in, for example, the $j^{th}$ shift register $SR_j$ shown in the upper portion of FIG. 4, the transistor T4 to which the carry signal $Cout_{(j-1)}$ of the previous shift register $SR_{j-1}$ is input is disposed in an upper part of the $j^{th}$ shifter register $SR_j$, which is close to the lower boundary of previous shift register $SR_{j-1}$ (not shown). The transistors T15 and T1 of $SR_j$ which receive the CK1 clock signal from the CKV transmission line extend horizontally adjacent to the upper boundary of the $j^{th}$ shifter register $SR_j$, and the transistors T7, T10 and T12 which also receive the CK1 clock signal from the CKV transmission line are also disposed adjacent to the upper boundary of the $j^{th}$ shifter register $SR_j$, but vertically under the transistor T15. In addition, the transistors T11 and T5 of $SR_j$ which receive the CK2 clock bar signal from the CKVB transmission line arriving from thereunder are disposed in a lower left boundary part of the $j^{th}$ shifter register $SR_j$. The transistor T6 which receives the initialization signal INT arriving from the left of $SR_j$ is disposed in a leftmost part of the $j^{th}$ shifter register $SR_j$. Also, the transistors T2, T3, T8, T9, T13, T5, T6 which receive the DC voltage signal of terminal GV from the Vss transmission line extend horizontally in a lower boundary part of the $j^{th}$ shifter register $SR_j$.

The wiring unit LS includes first through $n^{th}$ vertically elongated signal lines, where n is a natural number. The first through $n^{th}$ vertical signal lines (e.g., the ones denoted as 21-25 in FIG. 5) extend parallel to each other in a substantially vertical direction. The first through $n^{th}$ vertical signal lines are arranged sequentially in order of their distance from the left side boundaries of adjacent shift registers $SR_1$ through $SR_{n+1}$, with the first such vertical signal line (e.g., Vss 21) being farthest away from the corresponding adjacent edge boundaries of the adjacent layouts of shift registers $SR_1$ through $SR_{n+1}$. In FIGS. 4 through 6, first through fifth signal lines 21 through 25, for example, are arranged sequentially in order of their distance from the shift registers $SR_1$ through $SR_{n+1}$, with the first signal line 21 (Vss) being farthest from the shift registers $SR_1$ through $SR_{n+1}$.

More specifically, the wiring unit LS includes as its first vertical signal line 21, the DC voltage signal line which delivers the DC voltage signal Vss. Moreover, the wiring unit LS includes as its second vertical signal line 22, the scan start signal line which delivers the scan start signal STVP, as its third vertical signal line 23, the initialization signal line which delivers the initialization signal INT, as its fourth vertical signal line 24, the clock signal line which delivers the clock signal CKV, and as its fifth vertical signal line 25, the clock bar signal line which delivers the clock bar signal CKVB. The number of differently phased ones of such vertical clock signal lines (e.g., 24, 25) may vary and when more than two such vertical clock signal lines (e.g., 24, 25) are provided, the connections to the CK1 and CK2 terminals of each register stage may vary depending on design specifics. In FIGS. 4 and 5, the DC voltage signal line (e.g., the first vertical signal line 21), the scan start signal line (e.g., the second vertical signal line 22), the initialization signal line (e.g., the third vertical signal line 23), the clock signal line (e.g., the fourth vertical signal line 24) and the clock bar signal line (e.g., the fifth vertical signal line 25) are arranged sequentially from left to right adjacent to the left edge boundaries of the corresponding shift registers, with the clock bar vertical signal line 25 being located closest to such adjacent to the left edge boundaries of the shift registers $SR_1$ through $SR_{n+1}$ and the DC voltage vertical signal line 25 being located farthest away from the left edge boundaries.

The first through $n^{th}$ vertical signal lines are connected to the shift registers SR' through $SR_{n+1}$. The DC voltage signal line (e.g., the first signal line 21) and the initialization signal line (e.g., the third signal line 23) are connected to each of the shift registers $SR_1$ through $SR_{n+1}$. On the other hand, the scan start signal line (e.g., the second signal line 22) is connected only to the first and to the last shift registers $SR_1$ and $SR_{n+1}$. Accordingly, in FIGS. 4 and 5, the scan start signal line (e.g., the second signal line 22) is not shown as being connected to the $j^{th}$ shift register $SR_j$. In FIGS. 4 and 5, the clock signal line (e.g., the fourth signal line 24) and the clock bar signal line (e.g., the fifth signal line 25) are located near the upper and lower boundaries of the shift registers $SR_1$ and $SR_{n+1}$ and are alternately connected to respective ones of the Ck1 and CK2 terminals of each of the shift registers $SR_1$ and $SR_{n+1}$. Since substantially all current is sunk through it, the DC voltage vertical signal line carries more current. Therefore, the DC voltage vertical signal line 21 should have a smaller resistivity per unit length than the other vertical signal lines. In one embodiment, the DC voltage vertical signal line is formed with a greater width (as seen from a top plan view) than the other vertical signal lines.

Referring to FIG. 5 and in terms of more specifics, the first vertical signal line 21 is connected into the interiors of each of the shift registers $SR_1$ through $SR_{n+1}$ by way of a corresponding set of first horizontal connection lines 81. Each first horizontal connection line 81 includes a first cross-layer contact portion 81a and a second cross-layer contact portion 81b.

The first cross-layer contact portion 81a is a region which is formed by contiguously extending an end of the first horizontal connection line 81 through corresponding openings in one or more insulation (dielectric) layers so as to directly contact the first vertical signal line 21. In one embodiment, the first contact portion 81a is formed through a plurality of contact holes 71 that expose an upper surface of the first vertical signal line 21. The first connection line 81 is thus directly connected to the first signal line 21 by way of the contact holes 71.

The second cross-layer contact portion 81b is a region which is formed by extending the other end of the first connection line 81 contiguously through one or more openings of a one or more insulation (dielectric) layers so as to directly contact a shift register wiring 61 provided in the corresponding one of shift registers $SR_1$ through $SR_{n+1}$. In one embodiment, the second contact portion 81b overlaps a bent extension portion 61a of the shift register wiring 61, and a plurality of contact holes 72 are provided along that bent extension portion 61a for exposing the underlying shift register wiring 61 whereby any one or more of the plural contact holes 72 can provide a good contact between the second contact portion 81b and its overlapped area along the extension portion 61a of the shift register wiring 61.

Referring to the example embodiment of FIG. 6, a first insulating film 30 is formed over the base substrate 10 after the first through fifth vertical signal lines 21 through 25 are formed on the base substrate 10. The shift register wiring 61 is thereafter formed on the first insulating film 30. A second insulating film 70 is then formed over the shift register wiring 61 and the first insulating film 30. Respective contact holes 71 and 72 are formed and then the first horizontal connection line 81 is formed on the second insulating film 70.

The first through fifth vertical signal lines 21 through 25 and the shift register wiring 61 may each be made for example of an aluminum (Al)-based metal such as Al and/or an Al alloy, a silver (Ag)-based metal such as Ag and/or an Ag alloy, a copper (Cu)-based metal such as Cu and/or a Cu alloy, a molybdenum (Mo)-based metal such as Mo and/or a Mo alloy, chrome (Cr), titanium (Ti), or tantalum (Ta) or appropriate multi-layer combinations of two or more of these.

The first insulating film 30 may be formed of an inorganic material such as a silicon nitride or a silicon oxide, or a low-k insulating material formed by plasma enhanced chemical vapor deposition (PECVD), such as a-Si:C:O or a-Si:O:F. The first insulating film 30 may be formed to a thickness of 3,000 to 5,000 Å.

The shift register wiring 61 extends on the first insulating film 30. However, the shift register wiring 61 does not extend onto the first through $n^{th}$ vertical signal lines 21 through 25. Also, as shown in FIG. 6, the shift register wiring 61 is spaced apart from the second through $n^{th}$ vertical signal lines 21-25 by the combined thickness of dielectric layers 70 and 30. Thus, even when static electricity flows into one or more of the second through $n^{th}$ vertical signal lines 21-25 of the gate-line driver 400, it is unlikely to rapidly breakdown and through the double layer of dielectric layers 70 and 30 and thus it is unlikely to produce a surge current that can cause one or more of the shift register wiring 61 and the second through $n^{th}$ vertical signal lines 21-25 to be burned out.

The second insulating film 70 is formed on the first insulating film 30 as mentioned. The second insulating film 70 may be formed of an inorganic material such as a silicon nitride or a silicon oxide, an organic material having photosensitivity and superior planarization characteristics, or a low-k insulating material formed by PECVD, such as a-Si:C:O or a-Si:O:F. The second insulating film 70 may be formed to a thickness of 1,500 through 3,000 Å. The second insulating film 70 includes the contact holes 71 exposing the first signal line 21 and the contact holes 72 exposing the shift register wiring 61.

As mentioned, the first horizontal connection line 81 is formed on the second insulating film 70. The first contact portion 80a and the second contact portion 80b are connected to form the first connection line 81. The first connection line 81 may be made of indium tin oxide (ITO) or indium zinc oxide (IZO) and it may be formed to a width of 5 to 50 μm.

As described above, the first contact portion 81a is formed on or close to the first vertical signal line 21 in order to be in contact with the first signal line 21. However, the second contact portion 81b is located between the bulk of circuitry of each of the shift registers $SR_1$ through $SR_{n+1}$ and the fifth vertical signal line 25 most adjacent to the left boundary of that bulk of circuitry. Accordingly, the shift register wiring 61 formed on the first insulating film 30 terminates before crossing above the fifth signal line 25 as opposed to extending above any of the first through $n^{th}$ signal lines 21-25. That is, the shift register wiring 61 is not formed in close overlapping proximity with one or more of the second through fifth signal lines 22 through 25 such that that static current can easily surge from one of those lines 22 through 25 up through the dielectric and into the shift register wiring 61.

In addition, since the first horizontal connection line 81 including the first and second contact portions 81a and 81b is formed on the second insulating film 70, a double dielectric layer comprised of the first and second insulating films 30 and 70 is interposed between the second through fifth vertical signal lines 22 through 25 and the first connection line 81. That is, a thicker insulating film is formed between the second through fifth signal lines 22 through 25 and the first connection line 81 and this helps to reduce the danger that they will by burned out by a surge of static electricity current flowing into the gate-line driver 400 by way of any one or more of lines 22-25.

Additionally, the first vertical signal line 21 is located farthest from the bulk circuitry of the shift registers $SR_1$ through $SR_{n+1}$. To connect the first vertical signal line 21 to each of the shift registers $SR_1$ through $SR_{n+1}$, the shift register wiring 61 may be formed on the first insulating film 30 to overlap the second through $n^{th}$ signal lines. In this case, however, only the first insulating film 30 exists as separation for example between the second through $n^{th}$ vertical signal line Thus, the relative distance between the second vertical through $n^{th}$ signal lines and the shift register wiring 61 is reduced, thus putting the shift registers at risk of being burned out by static electricity. For this reason, the first signal line 21 is connected to each of the shift registers $SR_1$ through $SR_{n+1}$ only by way of the first connection line 81 which line is also spaced apart by double films 30 and 70 from the other vertical lines 21-25.

As shown in FIGS. 4 through 6, the first vertical signal line 21 may be the DC voltage signal line. The DC voltage signal line may be formed wider than the other vertical signal lines in order to reduce its resistivity. Also it may be placed first and thus closest to an edge of the substrate so as to protectively ring around the substrate and first absorb and redistribute any static shock that comes in from the edge of the substrate.

The shift register wiring 61 includes a gate line and a source or drain line formed in each of the shift registers $SR_1$ through $SR_{n+1}$. The shifter register wiring 61 includes the extension portion 61a formed by extending an end thereof. The extension portion 61a is overlapped by the second contact portion 81b, and the contact holes 72 expose the shift register wiring 61 multiple times. In addition, the first through $n^{th}$ signal lines formed in the wiring unit LS are connected to deliver respective external signals to the bulk circuitry of each of the shift registers $SR_1$ through $SR_{n+1}$. When the first signal line 21 is the DC voltage signal line, it may be connected to serve as a static electricity absorbing and redistributing conductor for each of the shift registers $SR_1$ through $SR_{n+1}$.

Here, at least one of the second through $n^{th}$ vertical signal lines 22-25 may be connected to each of the shift registers $SR_1$ through $SR_{n+1}$ by at least one of second through $n^{th}$ horizontal connection lines of similar structure to the detailed structure of the first horizontal connection line 81. In FIG. 5 for example, the third vertical signal line 23 INT) is shown connected to $SR_j$ by a third horizontal connection line 83.

The third horizontal connection line 83 includes its own corresponding first contact portion 83a and a second contact portion 83b. The first contact portion 83a extends through plural dielectric layers (e.g., 30 and 70) to contact the third vertical signal line 23 at multiple locations there-along. The second contact portion 83b is located between the $n^{th}$ vertical signal line (25) and the left boundary each of the shift registers $SR_1$ through $SR_{n+1}$ and is connected multiple times to each of the shift registers $SR_1$ through $SR_{n+1}$ as is indicated in FIG. 5.

In other words, the first contact portion 83a extends through plural ones of spaced apart contact holes 73 which expose the third signal line 23 in multiple places so as to thereby more assuredly connect its end of the third horizontal connection line 83 to the third vertical signal line 23. The second contact portion 83b similarly overlaps an extension portion 62a formed by extending an end of a shift register wiring 62 and includes multiple spaced apart contact holes 74 exposing the shift register wiring 62 in different places so as to thereby more assuredly connect its end of the third horizontal connection line 83 to the corresponding extension portion 62a of the shift register wiring.

Although not shown in the drawings, the corresponding shift register wiring 62 is formed on the first insulating film 30 but does not extend directly over the third through $n^{th}$ signal lines. In addition, the third horizontal connection line 83 is formed on the second insulating film 70 which is disposed above the first insulating film 30. Since the first and second insulating films 30 and 70 are interposed between the third through $n^{th}$ signal lines and the third connection line 83, the third through $n^{th}$ signal lines are located relatively far apart from the third connection line 83. Accordingly, the third through $n^{th}$ signal lines and the third connection line 83 can be prevented from being burned by static electricity flowing into the gate driver 400.

The third vertical signal line 23 may be any type of signal line, such as the scan start signal line (STVP), the initialization signal line (INT), a first clock signal line (e.g., CKV), or a clock bar signal line (e.g., CKVB). In the embodiment of FIG. 5, the third vertical connection line 23 is shown to be the initialization signal line. When the third signal line 23 is the initialization signal line, the shift register wiring 62 may be a gate line of transistor T6. This is because the initialization signal line is connected to the gate line of the T6 transistor of each of the shift registers $SR_1$ through $SR_{n+1}$.

The $n^{th}$ vertical signal line (e.g., the fifth signal line 25) which is the last signal line and thus closest to the shift registers $SR_1$ through $SR_{n+1}$ is connected to each of the shift registers $SR_1$ through $SR_{n+1}$ by a shift register clock wiring 63 extending to the $n^{th}$ signal line.

Specifically, as shown in FIG. 5, the shift register wiring 63 is extended to the fifth signal line 25, and the extended shift register wiring 63 and the fifth signal line 25 are connected to each other by a fifth and relatively short, horizontal connection line 95. Here, an extension portion 63a is formed at an end of the extended shift register wiring 63.

The fifth connection line 95 overlaps the fifth signal line 25 and overlaps the extension portion 63a of the shift register wiring 63, and uses contact holes 75 and 76 to make contact with the underlying conductors. More specifically, the fifth signal line 25 and the shift register wiring 63 are connected by the contact holes 75 and 76.

Although the shift register wiring 63 is extended to the $n^{th}$ signal line (e.g., the fifth signal line 25) which is the last signal line and closest to the shift registers $SR_1$ through $SR_{n+1}$, it is not formed directly above the first through $n^{th}$ signal lines. Therefore, the shift register wiring 63 and the first through $n^{th}$ signal lines are prevented from being burned by static electricity flowing into the gate driver 400.

Figure 7:
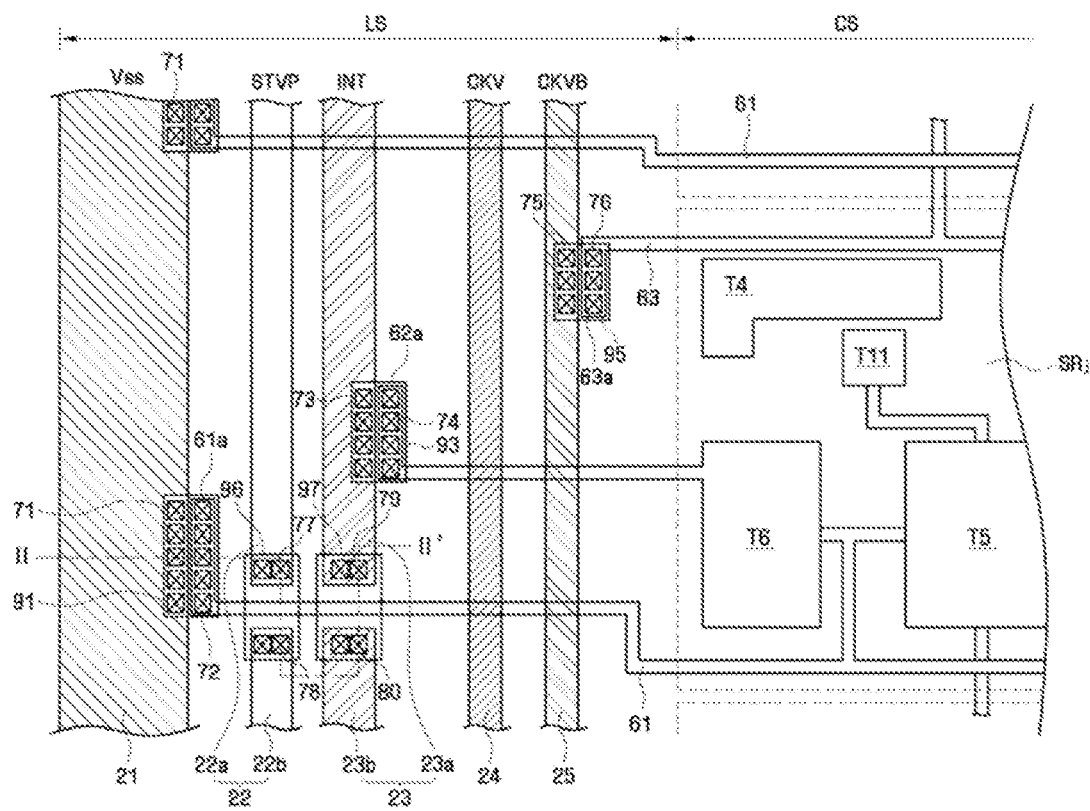
FIG. 7 is a layout diagram of a wiring unit of a gate driver according to another exemplary embodiment of the present disclosure.
Figure 8:
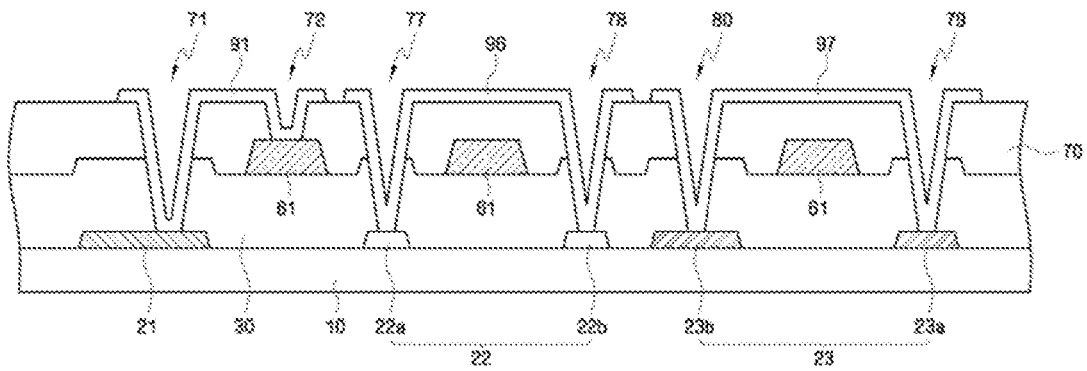
FIG. 8 is a cross-sectional view of the wiring unit taken along the line II-II' of FIG. 7.

Hereinafter, another gate-line driver circuit and an LCD including the same according to another exemplary embodiment will be described with reference to FIGS. 7 and 8. FIG. 7 is a layout diagram of a wiring unit LS of the second gate-line driver 400' according to the second exemplary embodiment. FIG. 8 is a cross-sectional view of the wiring unit LS taken along the line II-II' of FIG. 7. For simplicity, elements having the same functions as those of the previous exemplary embodiment of FIGS. 1 through 6 are indicated by like reference numerals, and thus their description will be omitted. The gate-line driver 400' and the LCD according to the current exemplary embodiment have substantially the same structures as the gate driver 400 and the LCD 10 according to the previous exemplary embodiment, except for the connection structure between the wiring unit LS of the gate driver 400 and shift registers $SR_1$ through $SR_{n+1}$. Thus, the following description will focus on this difference.

The gate driver 400' includes a circuit unit CS which includes a plurality of shift registers $SR_1$ through $SR_{n+1}$ and the wiring unit LS which delivers various signals (Vss, STVP, INT, CKV, CKVB, etc.) to the shift registers $SR_1$ through $SR_{n+1}$.

The wiring unit LS includes first through $n^{th}$ vertical signal lines, where n is a natural number. The first through $n^{th}$ vertical signal lines extend parallel to each other in a substantially vertical direction. The first through $n^{th}$ vertical signal lines are arranged sequentially in order of their distance from the shift registers $SR_1$ through $SR_{n+1}$, with the first vertical signal line being farthest from the shift registers $SR_1$ through $SR_{n+1}$.

A first vertical signal line 21 is connected to each of the shift registers $SR_1$ through $SR_{n+1}$ by a relatively short sixth horizontal connection line 91. Here, a shift register wiring 61 extends to the first signal line 21 and is connected to the relatively short sixth connection line 91.

The Vss conveying shift register wiring 61 includes a vertically elongated extension portion 61a formed by extending an end thereof. The sixth connection line 91 overlaps the extension portion 61a and makes contact to it at plural points (72). The sixth connection line 91 also overlaps the first signal line 21 and makes contact to it at plural points (71). As seen, plural contact holes 71 and 72 are formed in regions in which the sixth connection line 91 overlaps the first signal line 21 and the extension portion 61a, respectively. The first signal line 21 (Vss) and the shift register wiring 61 are thus connected plural times to each other by means of the corresponding portions of the sixth connection line 91 where the latter extends in and out through the contact holes 71 and 72.

Since the shift register wiring 61 extends to and contacts the first signal line 21, as shown in FIG. 8, the shift register wiring 61 extends closely under (bit not connected to) electrostatic bridge conductors 96 and 97 which are provided to overlap the shift register wiring 61 at predetermined regions of one or more of the second through $n^{th}$ signal lines 22-25. More specifically, in FIG. 8, at least two of the second through $n^{th}$ vertical signal lines (22, 23) are forked and the space between the fork tongs is partially overlapped with the shift register wiring 61 while the forks are connected to one another by electrostatic bridge conductors 96 and 97 (also referred to herein as horizontal connection lines).

Thus in FIGS. 7 and 8, each of a second vertical signal line 22 and a third vertical signal line 23 is divided into two sections (fork tongs) 22a and 22b of second vertical signal line 22, or 23a and 23b of third vertical signal line 23 and the space between the two sections (fork tongs) is insulatively overlapped by the Vss-carrying shift register wiring 61. Here, the second signal line 22 may be a scan start signal line, and the third signal line 23 may be an initialization signal line.

The two sections 22a and 22b of the second signal line 22 are connected by a $(7-1)^{th}$ horizontal connection line 96 (also called an electrostatic bridge conductor here), and the two sections 23a and 23b of the third signal line 23 are connected by a $(8-1)^{th}$ horizontal connection line 97 (also referenced to as a second electrostatic bridge conductor here). The $(7-1)^{th}$ connection line 96 extends into contact holes 77 and 78 formed to expose respective ends of the two sections 22a and 22b of the second signal line 22, and the $(8-1)^{th}$ connection line 97 extends into contact holes 79 and 80 formed to expose respective ends of the two sections 23a and 23b of the third signal line 23. The two sections 22a and 22b of the second signal line 22 are thus electrically connected or bridged to each other by the bridge 96 made between contact holes 77 and 78, and the two sections 23a and 23b of the third signal line 23 are electrically connected or bridged to each other by the bridge 97 made between contact holes 79 and 80.

Referring to the details of FIG. 8, a first insulating film 30 is formed on the first through fifth vertical signal lines 21 through 25, and the shift register wiring 61 extends on the first insulating film 30. Here, the second vertical signal line 22 and the third vertical signal line 23 are not formed under regions of the shift register wiring 61 so that the second signal line 22 and the third signal line 23 are not directly overlapped with the shift register wiring 61 A second insulating film 70 is formed on the first insulating film 30 and on the shift register wiring 61. The sixth connection line 91, the $(7-1)^{th}$ connection line 96 and the $(8-1)^{th}$ connection line 97 are formed on the second insulating film 70. The first insulating film 30 and the second insulating film 70 include contact holes 71, 72, 77, 78, 79 and 80 exposing the first through third signal lines 21 through 23 and the shift register wiring 61. The respective two sections 22a and 22b of the second signal line 22 and the respective two sections 23a and 23b of the third signal line 23 are connected (bridged to each other) by the $(7-1)^{th}$ connection line 96 and the $(8-1)^{th}$ connection line 97, respectively. The $(7-1)^{th}$ connection line 96 and the $(8-1)^{th}$ connection line 97 may be made of ITO or IZO As described above, in the current exemplary embodiment, the shift register wiring 61 is extended to and connected to the first signal line 21. In addition, a signal line located under the extended shift register wiring 61 is divided into two spaced apart sections (fork tongs) where the spacing is overlapped by the shift register wiring 61, and the two sections are connected to each other (bridged) by a connection line formed on the shift register wiring 61.

Here, since the non-grounded vertical signal line (e.g., 22 or 23) is not formed directly under the shift register wiring 61, static electricity that may flow into the gate-line driver circuit 400 by way of one of the non-grounded vertical signal lines (e.g., 22 or 23) does not dissipate its energy by burning out the signal line or the shift register wiring 61 but instead does so more preferentially by burning out the sacrificial fuse provided by one of the electrostatic bridge conductors or by dissipated itself into the wide conductive region provided by the outermost and first vertical signal line 21. In other words, due to the process of forming the sacrificial connection lines (e.g., 96, 97) on the second insulating film 70, the shift register wiring 61 and the main vertical connection lines (e.g., 22, 23) are prevented from being burned by the static electricity.

A gate driver circuit according to an exemplary embodiment of the present disclosure is thus structured such that its elements are prevented from being burned by static electricity which might flow into the gate driver circuit in the process of forming (e.g., assembling) the Liquid Crystal Display (LCD) device.

Thus an LCD device according to an exemplary embodiment of the present disclosure includes a gate driver circuit formed on a substrate and structured to prevent its active elements and/or the vertical signal lines (e.g., 22-25) that connect to the gate driver circuit from being burned by static electricity that may flow into the LCD device from activities occurring in the manufacturing facilities or elsewhere. Accordingly, productivity can be improved, and costs are reduced.

While the present disclosure of invention has been particularly shown and described with reference to exemplary embodiments thereof, it will be understood in light of the foregoing by those of ordinary skill in the art that various changes in form and detail may be made without departing from the spirit and scope of the present teachings. The exemplary embodiments should be considered in a descriptive sense only and not for purposes of limitation.

What is claimed is:
1. A display panel comprising:
a substrate;
a gate driver disposed on the substrate, the gate driver comprising:
a wiring unit which receives signals; and
a circuit unit which outputs driving signals in response to the signals received from the wiring unit, the circuit unit comprising a shift register and a first shift register wiring connected to the shift register, wherein the wiring unit comprises first through n-th signal lines (n is a natural number greater than one) arranged sequentially adjacent to the shift register, wherein the first signal line is located farthest from the shift register and the n-th signal line is closest from the shift register, wherein the first signal line is electrically connected to the shift register by a first connection line, the first connection line comprising a first contact portion connected to the first signal line and a second contact portion connected to the first shift register wiring, wherein the second contact portion is disposed between the n-th signal line and the shift register in a plan view, and wherein the first through n-th signal lines are disposed on a first plane, the first shift register wiring is disposed on a second plane different from the first plane, and the first connection line is disposed on a third plane different from the first plane and the second plane.

2. The display panel of claim 1, further comprising a first insulating layer disposed on the first through n-th signal lines, and a second insulating layer disposed on the first insulating layer, wherein the first shift register wiring is disposed between the first insulating layer and the second insulating layer, and the first connection line is disposed on the second insulating layer.

3. The display panel of claim 1, wherein the first shift register wiring does not overlap the first signal line in a plan view.

4. The display panel of claim 3, wherein the first shift register wiring does not overlap the first through n-th signal lines in a plan view.

5. The display panel of claim 1, wherein the first contact portion overlaps the first signal line in a plan view.

6. The display panel of claim 1, wherein the second contact portion overlaps the first shift register in a plan view.

7. The display panel of claim 1, wherein the first connection line is made of indium tin oxide (ITO) or indium zinc oxide (IZO).

8. The display panel of claim 1, wherein the first signal line is a direct current (DC) voltage signal line which receives a DC voltage signal.

9. The display panel of claim 1, wherein the first shift register wiring is connected to at least one of a gate line of the shift register or a source line of the shift register or a drain line of the shift register.

10. The display panel of claim 1, further comprising a second shift register wiring connected to the shift register, wherein at least one of the second through n-th signal lines is connected to the shift register by a respective at least one of second through n-th connection lines, wherein the at least one of the second through n-th connection lines comprises a first contact portion connected to the at least one of the second through n-th signal lines and a second contact portion connected to the second shift register wiring, and wherein the second contact portion of the at least one of the second through n-th connection lines is disposed between the n-th signal line and the shift register in a plan view.

11. The gate driver of claim 1, wherein the first through n-th signal lines comprise a DC voltage signal line which receives a DC voltage from an external source, a scan start signal line which receives a start signal for starting an operation of the circuit unit, a clock signal line which receives a clock signal, a clock bar signal line which receives a clock bar signal, and an initialization signal line which receives an initialization signal.

12. A display panel comprising:

a substrate;

a gate driver disposed on the substrate, the gate driver comprising:

a wiring unit which receives signals; and a circuit unit which outputs driving signals in response to the signals received from the wiring unit, the circuit unit comprising a shift register and a shift register wiring connected to the shift register, wherein the wiring unit comprises first through n-th signal lines (n is a natural number greater than one) arranged sequentially adjacent to the shift register, wherein the first signal line is electrically connected to the shift register by a first connection line, the first connection line comprising a first contact portion connected to the first signal line and a second contact portion connected to the shift register wiring, and the display panel further comprising a first insulating layer disposed on the first through n-th signal lines, and a second insulating layer disposed on the first insulating layer, wherein the shift register wiring is disposed between the first insulating layer and the second insulating layer, and the first connection line is disposed on the second insulating layer.

13. The display panel of claim 12, wherein the first line is located farthest from the shift register and the n-th signal line is closest from the shift register.

14. The display panel of claim 12, wherein the shift register wiring does not overlap the first signal line in a plan view.

15. The display panel of claim 14, wherein the shift register wiring does not overlap the first through n-th signal lines in a plan view.

16. The display panel of claim 12, wherein the first contact portion overlaps the first signal line in a plan view.

17. The display panel of claim 12, wherein the second contact portion overlaps the shift register wiring in a plan view.

18. A display panel comprising:

a substrate;

a gate driver disposed on the substrate, the gate driver comprising:

a wiring unit which receives signals; and a circuit unit which outputs driving signals in response to the signals received from the wiring unit, the circuit unit comprising a shift register and a shift register wiring connected to the shift register, wherein the wiring unit comprises first through n-th signal lines (n is a natural number greater than one) arranged sequentially adjacent to the shift register, wherein the first line is located farthest from the shift register and the n-th signal line is closest from the shift register, wherein the first signal line is electrically connected to the shift register by a first connection line, the first connection line comprising a first contact portion connected to the first signal line and a second contact portion connected to the shift register wiring, wherein the shift register wiring does not overlap the first signal line in a plan view, and wherein the first through n-th signal lines are disposed on a first plane, the shift register wiring is disposed on a second plane different from the first plane, and the first connection line is disposed on a third plane different from the first plane and the second plane.

19. The display panel of claim 18, wherein the shift register wiring does not overlap the first through n-th signal lines in a plan view.

20. The display panel of claim 18, wherein the first contact portion overlaps the first signal line in a plan view.

21. The display panel of claim 18, wherein the second contact portion overlaps the shift register wiring in a plan view.

* * * * *